United States Patent [19]

Sampei

[11] 3,961,280

[45] June 1, 1976

[54] AMPLIFIER CIRCUIT HAVING POWER SUPPLY VOLTAGE RESPONSIVE TO AMPLITUDE OF INPUT SIGNAL

[75] Inventor: Tohru Sampei, Toyokawa, Japan

[73] Assignee: Hitachi, Ltd., Japan

[22] Filed: Aug. 23, 1974

[21] Appl. No.: 499,916

[30] Foreign Application Priority Data
Aug. 25, 1973 Japan.................................. 48-94861

[52] U.S. Cl.................................... 330/40; 330/13; 330/18; 330/22
[51] Int. Cl.² ................................................. H03F 3/04
[58] Field of Search ................... 330/13, 15, 22, 18, 330/40, 70, 74

[56] References Cited
UNITED STATES PATENTS

| | | | |
|---|---|---|---|
| 3,181,079 | 4/1965 | Bregman.......................... | 330/22 X |
| 3,622,899 | 11/1971 | Eisenberg.............................. | 330/22 |
| 3,772,606 | 11/1973 | Waehner............................ | 330/40 X |

*Primary Examiner*—James B. Mullins
*Attorney, Agent, or Firm*—Craig & Antonelli

[57] ABSTRACT

There is provided an amplifier circuit wherein the changing of power supply voltages is effected in accordance with the amplitude of an input signal. The amplifier circuit comprises an amplifying transistor having its base adapted to receive an input signal and its emitter connected to a load, a switching transistor having its base and emitter connected respectively to the base and collector of the amplifying transistor, a first power source for supplying power to the collector of the switching transistor, and a second power source for generating a voltage lower than the output voltage of the first power source and supplying power to the collector of the amplifying transistor.

6 Claims, 10 Drawing Figures

AMPLIFIER CIRCUIT HAVING POWER SUPPLY VOLTAGE RESPONSIVE TO AMPLITUDE OF INPUT SIGNAL

BACKGROUND OF THE INVENTION

1. Field of the Invention

The present invention relates to amplifier circuits and more particularly to an amplifier circuit well suited for amplifying audio signals efficiently.

2. Description of the Prior Art

Output amplifiers heretofore known for amplifying audio signals have been of the type designed for class "B" amplification. Since the class B amplifier has a higher order of efficiency and produces less heat than the class "A" amplifier, it is suitable for use as a high power amplifier. Even in the class B output amplifier, however, the efficiency is on the order of 70 % at the maximum output and this efficiency decreases as the output decreases. Consequently, with a high power output amplifier comprising a class B output amplifier, the amount of heat generated is still great and this makes the design of heat dissipation difficult. With the output amplifier in the integrated circuit version, the maximum output obtainable is limited by the generation of heat.

For example, in the case of an output amplifier comprising a single transistor having its emitter connected to a load resistor, its collector adapted to receive a power supply voltage and its base adapted to receive an input signal, if $V_{CC}$ represents the power supply voltage and $V_{in}$ represents the voltage applied to the base, then the value of efficiency $\eta$ of this output amplifier is given by the following equation:

$$\eta = \frac{\text{power expended by load resistor}}{\text{power supplied from power source}} = \frac{V_{in}}{V_{CC}} \quad (1)$$

That is, the efficiency $\eta$ is improved as the input voltage $V_{in}$ becomes higher and gets closer to the power supply voltage $V_{CC}$.

The output amplifier for audio signals is used in such a manner that even when the voltage of the input signal is at the maximum, it does not exceed the power supply voltage to prevent the distortion in the waveform of the output signal and hence the degeneration of the tone quality. Consequently, the signal level setting is such that the signal of an amplitude which usually appears most frequently has a value considerably lower than the power supply voltage. Thus, the output amplifier of this type is used under conditions that cannot ensure a high efficiency.

SUMMARY OF THE INVENTION

It is an object of the present invention to provide an amplifier circuit wich has a high degree of efficiency and hence the generation of heat by its active elements is reduced.

It is another object of the present invention to provide an amplifier circuit of high efficiency suitable for audio signal amplification.

It is still another object of the present invention to provide an amplifier circuit which can be suitably realized in the form of an integrated circuit.

In accomplishing these and many other objects, the improved amplifier circuit provided in accordance with the present invention comprises a plurality of power sources for generating different voltages, and means for changing in steps the power supply voltages applied to an amplifying element in accordance with the amplitude of the input signal to the amplifying element, whereby the amplifying element is always operated to provide practically the maximum output.

DESCRIPTION OF THE PREFERRED EMBODIMENTS

Figure 1:
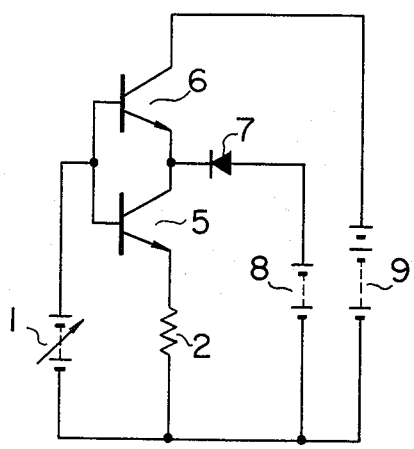
FIG. 1 is a basic circuit diagram showing an embodiment of an amplifier circuit according to the present invention.

Referring first to FIG. 1 illustrating a basic circuit diagram for an embodiment of this invention, numeral 1 designates a source of signals to be amplified, which is shown in the form of a variable DC power source. The signal from the signal source 1 is applied to the bases of transistors 5 and 6 which are connected to a common line. A load resistor 2 is connected to the emitter of the transistor 5. A voltage $V_1$ is applied from a first power source 8 through a diode 7 to the junction point of the collector of the transistor 5 and the emitter of the transistor 6. The collector of the transistor 6 is connected to a second power source 9 which generates a voltage $V_{CC}$ which is higher than the voltage $V_1$ generated by the first power source 8.

The transistor 6 serves to effect the changing of the power supply voltages applied to the collector of the transistor 5 in accordance with the amplitude of the input signal thereto.

The operation of the embodiment shown in FIG. 1 is as follows. Assuming that $V_{in}$ is the voltage of the input signal, if the input signal voltage $V_{in}$ is lower than the voltage $V_1$ from the first power source 8, i.e., if $0 \leq V_{in} < V_1$, then the transistor 6 is reversely biased between the base and the emitter thereof. Consequently, the transistor 6 is turned off and the current that flows through the load resistor 2 is supplied from the first power source 8 through the diode 7. In this case, the efficiency $\eta$ is given as $$\eta = \frac{V_{in}}{V_1} \quad (2)$$

On the other hand, when the input signal voltage $V_{in}$ is between the voltage $V_1$ and the voltage $V_{CC}$, i.e., when $V_1 < V_{in} \leq V_{CC}$, the transistor 6 is forward biased between the base and emitter thereof. As a result, the transistor 6 is turned on and the current flow through the load resistor 2 is supplied from the second power source 9 through the transistor 6. In this case, since the saturation voltage between the collector and the emitter of the transistor 6 is sufficiently low, if it is neglected, then the efficiency $\eta$ is given as $$\eta = \frac{V_{in}}{V_{cc}} \quad (3)$$

In other words, in the embodiment of FIG. 1, the transistor 5 operates as an amplifying element, and the transistor 6 operates as a switching element for changing the voltages applied to the collector of the transistor 5.

Figure 2:
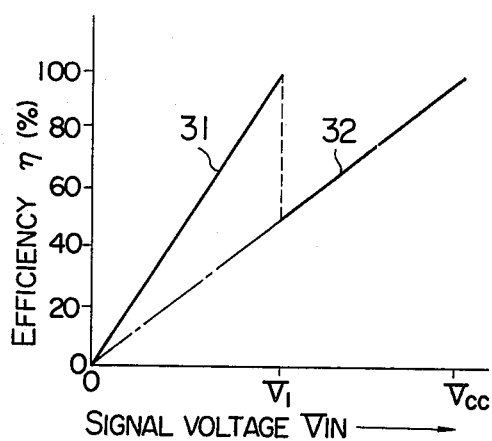
FIG. 2 is a graph showing the relationship between the input signal voltage and the efficiency of the amplifier circuit shown in FIG. 1.

FIG. 2 is a graph representing the above equations (2) and (3). In FIG. 2, numeral 31 represents equation (2) and numeral 32 represents equation (3). The line comprising the straight line 32 and a dot-and-dash line corresponds to the previously mentioned equation (1). As a result, as will be apparent from FIG. 2, in the lower ranges of the input signal voltage $V_{in}$ (i.e., $0 \leq V_{in} < V_1$), the efficiency $\eta$ is higher than in the case of the conventional amplifier circuits.

Generally, the conventional amplifier for audio signal amplification can operate at the maximum output only during a very brief period within its operating period, and it is usually operated at the output power considerably lower than the maximum output. Since the circuit shown in FIG. 1 is designed so that its efficiency is improved in the lower ranges of the input signal voltage $V_{in}$, that is, in the lower ranges of the output power, the efficiency of this circuit in the actual operation is improved considerably and hence the amount of heat generated by the amplifying element is reduced as compared with the conventional amplifier of the same output power rating.

In the embodiment of FIG. 1, the diode 7 is provided so that the current flowing from the second power source 9 into the transistor 6 is prevented from flowing into the first power source 8.

Figure 3:
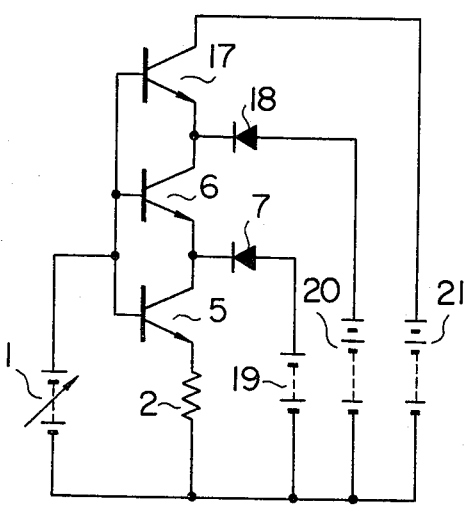
FIG. 3 is a basic circuit diagram showing another embodiment of the amplifier circuit according to the present invention.

FIG. 3 is a basic circuit diagram showing another embodiment of the invention. This embodiment differs from the embodiment of FIG. 1 in that it further includes an additional transistor for use to change-over the power source and an additional power source. In other words, the emitter of a transistor 17 is connected to the collector of the transistor 6, and the collector of the transistor 17 is connected to a third power source 21. The bases of the three transistors 5, 6 and 17 are connected to a common line to receive the input signal. A voltage $V_3$ is applied from a second power source 20 to the collector of the transistor 6 by way of a diode 18, and the collector of the transistor 5 receives a voltage $V_2$ from a first power source 19 through the diode 7. With $V_{CC}$ representing the voltage generated by the third power source 21, the voltages $V_2$, $V_3$ and $V_{CC}$ generated respectively by the first, second and third power sources are selected to meet with a relationship $V_2 < V_3 < V_{CC}$.

The embodiment of FIG. 3 is designed so that with the three transistors and the three power sources, the voltage applied to the collector of the amplifying transistor 5 is changed in three steps in accordance with the value of the input signal voltage $V_{in}$. The operation of this embodiment is basically the same as that of the embodiment of FIG. 1 except that the three different power supply voltages are selectively utilized.

Figure 4:
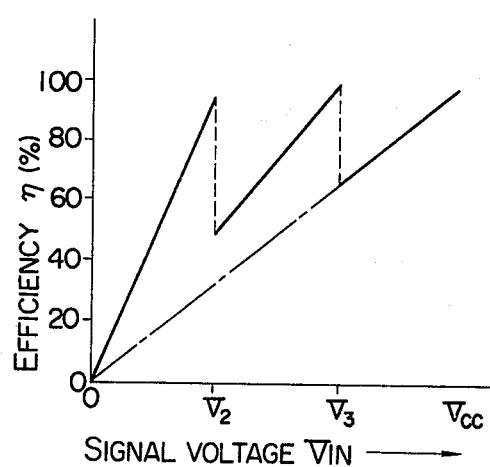
FIG. 4 is a graph showing the relationship between the input signal voltage and the efficiency of the circuit shown in FIG. 3.

FIG. 4 is a graph showing the efficiency of the embodiment shown in FIG. 3. In FIG. 4, the dot-and-dash line and the solid line extended therefrom corresponds to the above-mentioned equation (1). As will be seen from FIG. 4, the efficiency is improved further in the lower ranges of the input signal voltage $V_{in}$.

Further, by increasing the number of transistors and power sources, it is possible to provide an amplifier circuit in which the power supply voltage can be changed in more than three steps, and the efficiency of the circuit improves as the number of steps is increased.

Figure 5:
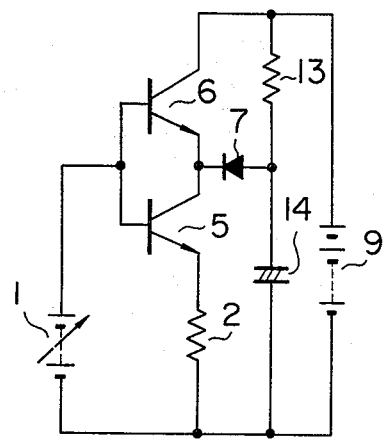
FIG. 5 is a circuit diagram showing still another embodiment of the invention which employs only a single power source.

FIG. 5 is a circuit diagram showing still another embodiment of the invention. While the operation of this embodiment is the same with the embodiment shown in FIG. 1, it differs from the latter in that one of the two power sources providing two different voltages is eliminated. In other words, current is supplied to the collector of the transistor 5 from the second power source 9 through a resistor 13 and the diode 7. Consequently, a voltage is applied to the collector of the transistor 5 which is lower than the voltage $V_{CC}$ generated by the power source 9 by an amount equal to the voltage drop across the resistor 13. While the voltage applied to the collector of the transistor 5 (this voltage corresponds to the first power supply voltage in the embodiment of FIG. 1) varies depending on the collector current, this variation is reduced by a capacitor 14.

Considering in the light of the power produced from the power source 9 and the power expended by the load resistor 2, the efficiency of the circuit shown in FIG. 5 is the same with that of the conventional circuit employing a single transistor and a single power source. However, a comparison between the heat loss expended by the transistor in the conventional circuit and that expended by the transistors 5 and 6 in the circuit of FIG. 5 indicates that the heat loss by the transistors 5 and 6 is smaller by an amount equal to the heat loss by the resistor 13. Consequently, by arranging the transistors 5 and 6 and the resistor 13 so that the transistors 5 and 6 are thermally separated from the resistor 13, the amount of heat generated by the transistors can be reduced as compared with the conventional circuit. This is advantageous in that in designing an amplifier, the use of transistors having lower ratings than hitherto required can be permitted for the same output power rating.

Where the variation in the collector voltage of the transistor 5 does not give rise to any difficulty (in fact, the corresponding change in the amplitude of the output signal is small as compared with the change in the collector voltage), the capacitor 14 may be eliminated. In this case, all of the emitter current of the transistor 6 flows into the collector of the transistor 5 and therefore the diode 7 may also be eliminated. In the event that the capacitor 14 and the diode 7 are eliminated, the amount of heat generated by the transistors 5 and 6 is also reduced as compared with the conventional circuit as mentioned in the description of the embodiment of FIG. 5.

Figure 6:
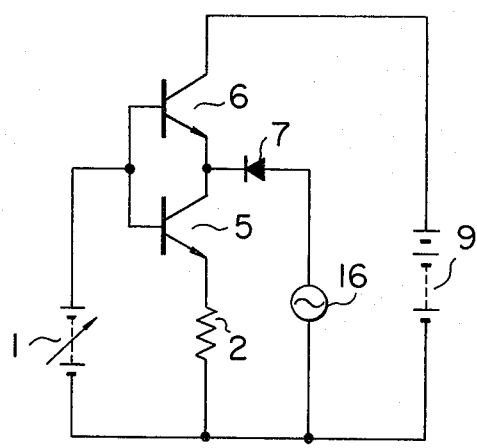
FIG. 6 is a circuit diagram showing still another embodiment of the invention employing only a single DC power source.

FIG. 6 is a circuit diagram showing still another embodiment of the present invention in which one of the two DC power sources is eliminated. In FIG. 6, numeral 16 designates an AC power source whose peak voltage is preset to a value lower than the DC voltage $V_{CC}$ generated by the second power source 9. This AC power source 16 may be provided by a transformer connected to a normal commercial AC power source. The diode 7, which prevents the emitter current of the transistor 6 from flowing into the AC power source 16, also serves to half-wave rectify the AC voltage generated by the AC power source 16. The operation of this embodiment is basically the same with the embodiment of FIG. 1 except that while the positive half cycles of the AC voltage generated by the AC power source 16 are applied to the collector of the transistor 5, the negative half cycles of the AC voltage are not applied to the collector of the transistor 5 due to the provision of the diode 7. Consequently, during the negative half cycles of the AC voltage, the power supply voltage $V_{CC}$ is applied to the collector of the transistor 5 from the power source 9 through the transistor 6 independently of the magnitude of the input signal voltage $V_{in}$. In this way, while the efficiency of this embodiment is lower than that of the embodiment shown in FIG. 1, it still has the advantage of requiring only a single DC power source and of operating at higher efficiency than the conventional circuit.

Figure 7:
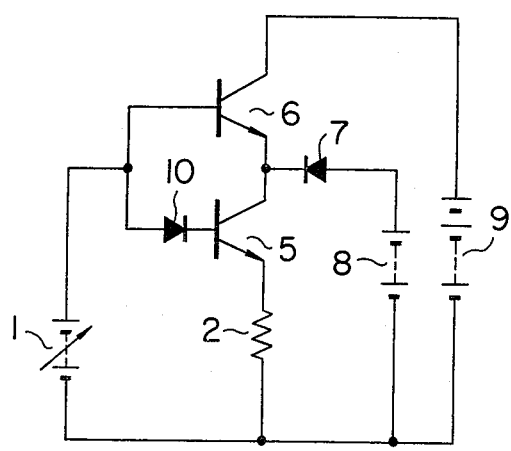
FIG. 7 is a circuit diagram showing still another embodiment of the invention, wherein the saturation of the amplifying transistor is prevented.

FIG. 7 is a circuit diagram showing still another embodiment of the invention. The circuit of FIG. 7 differs from the basic circuit of FIG. 1 in that a diode 10 is connected to the base of the transistor 5. In the circuit of FIG. 1, a detailed analysis of the operation of the circuit when the input signal voltage $V_{in}$ exceeds the voltage $V_1$ generated by the first power source 8 indicates the presence of the following problem. The transistor 6 is not turned on until the input signal voltage $V_{in}$ exceeds the collector voltage of the transistor 5 (this is equal to the emitter voltage of the transistor 6) by an amount equal to the base-emitter voltage $V_{BE}$ of the transistor 6. Consequently, when the value of the input signal voltage $V_{in}$ is in the range between $V_1$ and $V_1 + V_{BE}$, the transistor 5 is saturated between the collector and the emitter. That is, the transistor 5 is saturated before the conduction of the transistor 6 thus introducing distortion in the waveform of the output signal. Therefore, to prevent the introduction of distortion in the waveform of the output signal during the change-over from one power supply voltage to another, it is necessary to arrange so that the saturation of the transistor 5 is prevented until the transistor 6 is turned on. This may be achieved by the provision of the diode 10 as shown in FIG. 17. In this way, when $V_1 \leq V_{in}$, the voltage between the collector and the emitter of the transistor 5 is lower than the saturation level by an amount equal to the threshold value of the diode 10 and thus the transistor 5 is not saturated. This diode 10 may be a Zener diode or a resistor since it is only required to produce a voltage difference equal to the base-emitter voltage $V_{BE}$ of the transistor 6.

Figure 8:
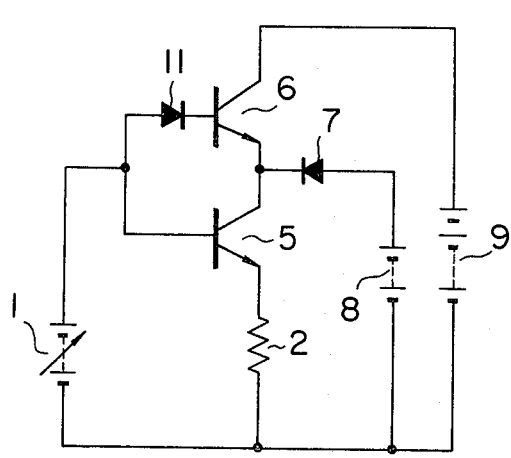
FIG. 8 is a circuit diagram showing still another embodiment of the invention, wherein the reverse biasing of the transistor for use to change-over the power transistor is prevented.

FIG. 8 is a circuit diagram showing still another embodiment of the invention. This embodiment differs from the embodiment of FIG. 1 in that a diode 11 is connected to the base of the transistor 6. Since a reverse bias is applied between the base and the emitter of the transistor 6 when the input signal voltage $V_{in}$ is lower than the voltage $V_1$ generated by the first voltage source 8, the base-emitter section of the transmitter 6 must be able to withstand a reverse voltage higher than the voltage $V_1$. However, since the maximum withstand inverse voltage of the base-emitter section of a transistor is generally low, some means must be provided to protect the transistor 6. The diode 11 is provided for this purpose so as to prevent the flow of reverse current through the base-emitter junction of the transistor 6 and thus protects the base-emitter junction against the reverse voltage.

Further, while, in the embodiment shown in FIG. 8, the diode 11 is connected to the base of the transistor 6, the same results may be obtained by connecting the diode 11 to the emitter of the transistor 6. In this case, it is necessary to provide the diode 11 between the emitter of the transistor 6 and the junction point of the collector of the transistor 5 and the diode 7. With the diode 11 provided to protect the base-emitter section of the transistor 6 against the reverse voltage, also the saturation of the transistor 5 may be prevented by connecting to the base thereof the series connected two diodes 10 or any other element which provides the equivalent voltage drop.

Figure 9:
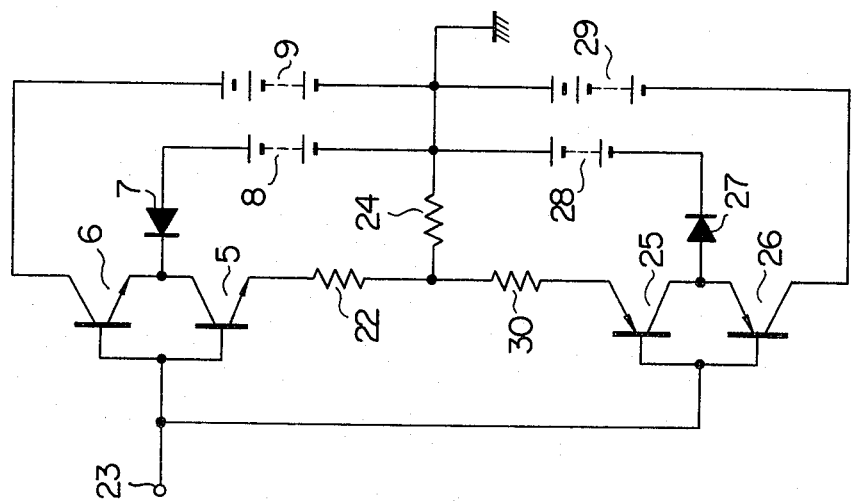
FIG. 9 is a basic circuit diagram showing still another embodiment of the invention, wherein the invention is applied to a push-pull amplifier circuit.

FIG. 9 is a basic circuit diagram of a push-pull amplifier circuit embodying the present invention. In this exemplary embodiment, the push-pull amplifier circuit is composed of two units of the circuit shown in FIG. 1. In FIG. 9, numeral 24 designates a load resistor, 22 and 30 resistors for respectively balancing the positive polarity and the negative polarity waveforms of the output signals. Transistors 25 and 26 correspond respectively to the transistors 5 and 6, and power sources 28 and 29 to the power sources 8 and 9. In this arrangement, the transistors 5, 6 and the transistors 25 and 26 are opposite in polarity with each other (i.e., PNP and NPN transistors), but is, they are connected in a so-called complementary configuration. Consequently, the power sources 28 and 29 generate voltages opposite in polarity to those generated by the power sources 8 and 9, and a diode 27 is connected in a direction opposite to that of the diode 7.

It is also possible to construct the circuit so that the transistors 5 and 6 consist of transistors which are of the same polarity type as the transistors 25 and 26, and the oppositely phased input signals are respectively applied to the bases of the transistors 5 and 6 and the bases of the transistors 25 and 26. In this way, it is possible to use only those power sources which generate voltages of one polarity only and thus the power supply circuitry can be simplified.

Figure 10:
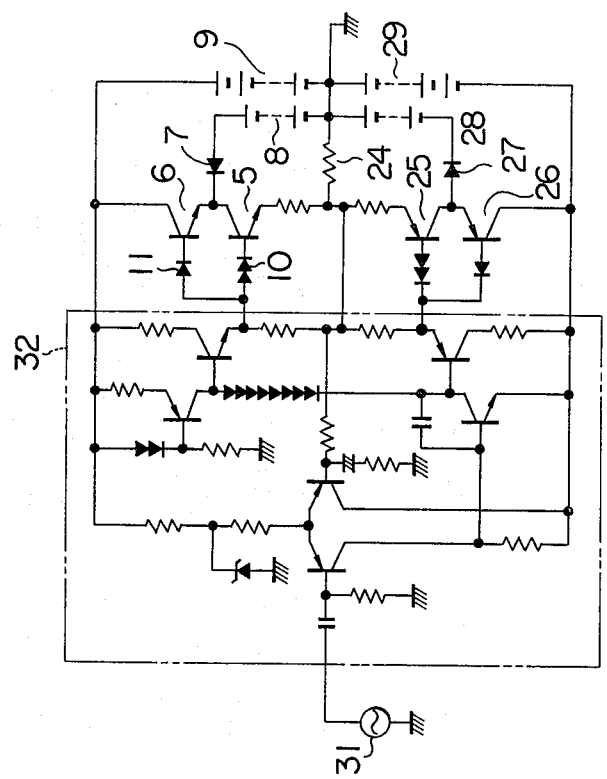
FIG. 10 is a circuit diagram showing still another embodiment of the invention, wherein the invention is applied to an audio amplifier.

FIG. 10 is a circuit diagram showing an exemplary form of an audio amplifier which embodies the present invention. In FIG. 10, numeral 31 designates a source of signals to be amplified, 32 a preamplifier circuit for driving an output amplifier circuit. The output amplifier circuit section comprises, in combination, the circuit shown in FIG. 9 and the diode 10 for use to prevent the saturation and the diode 11 for protecting against a reverse voltage which are respectively shown in FIGS. 7 and 8. A diode 10' is used as a saturation preventing diode which may be of a type comprising two ordinary diodes connected in series. The diode 10', along with the preamplifier circuit 32, may be very easily realized in the form of an integrated circuit.

While the preferred embodiments of the present invention have been described so far, those embodiments employing two or three power sources may be made to operate in the similar manner as the conventional circuit employing a single power source without change-over by opening the point connected to the first power source or the points connected to the first and second power sources, or alternately by connecting the first power source to the second power source or the third power source.

It will thus be seen that the amplifier circuit according to the present invention may operate as a highly efficient amplifier when it utilizes a plurality of power sources, whereas it may operate in the similar manner as the conventional amplifier when it utilizes only a single power source.

While the invention has been illustrated and described as embodied in an amplifier, the principle of the present invention may be applied to realize, for example, an oscillator which has a high degree of efficiency and which generates less heat.

What is claimed is:

1. An amplifier circuit of a high efficiency adopted to be used as an output circuit of an amplifier, said amplifier circuit comprising:
   a first transistor for amplifying an incoming input signal applied to a base of said first transistor;
   means for connecting an emitter of said first transistor to a reference potential point through means for passing a DC current;
   a second transistor having a base receiving said incoming input signal applied to the base of said first transistor and an emitter connected to a collector of said first transistor;
   a single power source for applying a bias voltage to each of said first and second transistors;
   means for connecting a collector of said second transistor to said power source;
   a series connection of a resistance element and a capacitive element connected in parallel with said power source, said capacitive element being provided on the side of said reference potential point;
   a diode connected between the junction point between the collector of said first transistor and the emitter of said second transistor and the junction point between said resistance element and said capacitive element; and
   a load connected to the emitter of said first transistor.

2. An amplifier circuit according to claim 1 further comprising an element connected to the base of said first transistor for producing a DC voltage drop across the element.

3. An amplifier circuit according to claim 1 further comprising a diode connected to the base of said second transistor in the forward direction with respect to the direction of the current flowing between the base and emitter of said second transistor.

4. An amplifier circuit of a high efficiency for use as an output circuit of an amplifier, said amplifier circuit comprising:
   a first transistor for amplifying an incoming input signal applied to a base of said first transistor;
   a load connected to an emitter of said first transistor;
   a second transistor having a base receiving said incoming input signal applied to the base of said first transistor and an emitter connected to a collector of said first transistor;
   a first power source for applying a collector bias to said first transistor;
   a first diode connected between the collector of said first transistor and said first power source to apply a bias voltage to the collector of said first transistor;
   a second power source for producing a voltage higher than the output voltage of said first power source;
   means for connecting the collector of said second transistor to said second power source;
   a second diode connected in series with a base emitter junction of said second transistor in the forward direction with respect to the direction of the current flowing between the base and the emitter of said second transistor; and
   an element connected to the base of said first transistor for producing a DC voltage drop across the element approximately equal to that produced across the series connection of said second diode and the base-emitter junction of said second transistor.

5. An amplifier circuit according to claim 4, wherein said element consists of two series connected diodes.

6. An amplifier circuit of a high efficiency for use as an output circuit of an amplifier, said amplifier circuit comprising:
   two input terminals for receiving a pair of input signals;
   first and second transistors of opposite conductivity types each constructed in a common collector configuration and having an emitter connected to a common load resistance;
   a pair of first and second power sources each having terminals of opposite polarities;
   a first diode connected between the collector of said first transistor and the terminal of said first power source;
   a second diode connected between the collector of said second transistor and the terminal of said second power source;
   a third transistor constructed in the same conductivity type as said first transistor and having an emitter connected to the collector of said first transistor;
   a fourth transistor constructed in the same conductivity type as said second transistor and having an emitter connected to the collector of said second transistor;
   a pair of third and fourth power sources each having terminals of opposite polarities for supplying a voltage having its absolute value higher than that of said pair of the first and second power sources, the terminal of said third power source being connected to the collector of said third transistor and the terminal of said fourth power source being connected to the collector of said fourth transistor;
   third and fourth diodes connected between said input terminals and the bases of said third and fourth transistors, respectively;
   first series-connected diodes connected between corresponding one of said input terminals and the base of said first transistor; and
   second series-connected diodes connected between the other of said input terminals and the base of said second transistor.

* * * * *